United States Patent [19]
Hirai et al.

[11] Patent Number: 5,994,031
[45] Date of Patent: Nov. 30, 1999

[54] METHOD OF PROCESSING PRESENSITIZED PLANOGRAPHIC PRINTING PLATE

[75] Inventors: Yoko Hirai; Yasuhisa Sugi, both of Hino, Japan

[73] Assignee: Konica Corporation, Tokyo, Japan

[21] Appl. No.: 08/923,119

[22] Filed: Sep. 4, 1997

[30] Foreign Application Priority Data

Sep. 9, 1996 [JP] Japan .................................... 8-237826

[51] Int. Cl.⁶ ................................ G03F 7/32; G03F 7/40
[52] U.S. Cl. ......................... 430/302; 430/165; 430/168; 430/169
[58] Field of Search .................... 430/302, 168, 430/169, 165

[56] References Cited

U.S. PATENT DOCUMENTS 5,250,393  10/1993  Imai et al. ............................. 430/302
5,464,724  11/1995  Akiyama et al. ....................... 430/302

*Primary Examiner*—John S. Chu
*Attorney, Agent, or Firm*—Finnegan, Henderson, Farabow, Garrett & Dunner, L.L.P.

[57] ABSTRACT

Disclosed is a method of processing an exposed presensitized planographic printing plate employing an automatic processor, the method comprising the steps of developing the exposed presensitized planographic printing plate with a developer; and washing the developed printing plate with a washing water, wherein the ratio W/D of the washing time W to the cross-over time D taken from completion of the developing step to the beginning of the washing step is 3 or more.

13 Claims, 3 Drawing Sheets

METHOD OF PROCESSING PRESENSITIZED PLANOGRAPHIC PRINTING PLATE

FIELD OF THE INVENTION

The present invention relates to a method of processing a presensitized planographic printing plate.

BACKGROUND OF THE INVENTION

In preparing a planographic printing plate from a presensitized planographic printing plate (hereinafter referred to also as a PS plate), a light sensitive layer of the PS plate is marked by a ball point pen in order to register an original through which image wise exposure is carried out, and then imagewise exposed. Thereafter, the exposed PS plate is developed with an alkaline developer to remove the light sensitive layer at non-image portions to obtain a planographic printing plate. However, the ball point pen ink on the light sensitive layer at non-image portions to be removed is not removed by the developer, but remains on the support of the planographic printing plate, resulting in a problem of stain occurrence in printing. This phenomenon is called residual ball point pen ink.

SUMMARY OF THE INVENTION

An object of the invention is to provide a method of processing a presensitized planographic printing plate, the method preventing the stain occurrence in printing, which is caused by the so-called residual ball point pen ink, which is a phenomenon that ball point pen ink on the light sensitive layer at non-image portions to be removed is not removed by developer but remains on the support of the planographic printing plate.

BRIEF EXPLANATION OF THE INVENTION

FIG. 1 is a schematic view of an automatic processor 1.
FIG. 2 is a schematic view of an automatic processor 2.
FIG. 3 is a schematic view of an automatic processor 3.

DETAILED DESCRIPTION OF THE INVENTION

Figure 1:
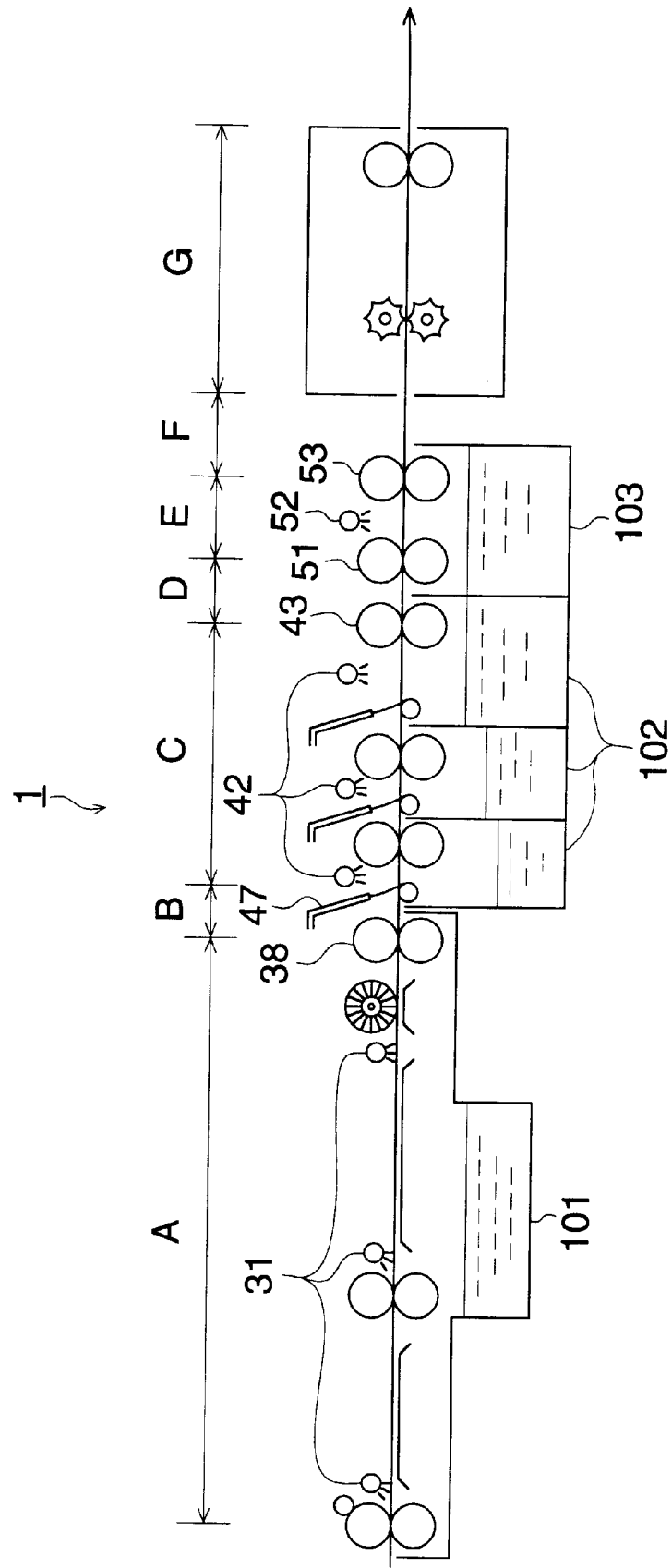

The above object of the invention can be attained by the following method:

1. a method of processing an exposed presensitized planographic printing plate employing an automatic processor, the method comprising the steps of developing the exposed presensitized planographic printing plate with a developer; and washing the developed printing plate with a washing water, wherein the ratio W/D of the washing time W to the cross-over time D taken from completion of the developing step to the beginning of the washing step is 3 or more,
2. the method of item 1 above, wherein the ratio W/D is 3 to 15,
3. the method of item 1 above, wherein the washing time is 0.1 to 20 seconds,
4. the method of item 1 above, wherein the developing time is 5 to 60 seconds,
5. the method of item 1 above, wherein the developer contains an alkali metal silicate,
6. the method of item 5 above, wherein the developer contains potassium in an amount of 20 to 100% based on the total gram-atom of the alkali metal,
7. the method of item 1 above, wherein the presensitized planographic printing plate comprises a support and provided thereon, a positive-working light sensitive layer,
8. the method of item 7 above, wherein the positive-working light sensitive layer contains an o-quinonediazide compound and an alkali soluble resin,
9. the method of item 1 above, wherein the presensitized planographic printing plate comprises a support and provided thereon, a negative-working light sensitive layer, or
10. the method of item 9 above, wherein the negative-working light sensitive layer contains a diazo resin and an alkali soluble resin.

The present inventors have made a study in order to solve the problem of the residual ball point pen ink, and found that it is the phenomenon that the light sensitive layer under the ball point pen ink (the ball point pen ink is on the light sensitive layer) is removed by developer but the ball point pen ink is re-adsorbed on the support.

The conventional method of processing a PS plate generally comprises a developing step in which development is carried out by immersing the PS plate in the developer and a washing step in which the washing is carried out by immersing the developed PS plate in water of a single tank. However, a conventional automatic processor comprising the above steps has a tendency that cross-over time taken from completion of the developing step to the beginning of the washing step is long and the washing time required for washing is short and therefore, is likely to cause the problem of the residual ball point pen ink.

The present inventors have solved the problem of the residual ball point pen ink by shortening the above described cross-over time so that time taken from removal of the light sensitive layer in the developing step till re-adsorption of the ball point pen ink on the support of the developed PS plate is short, and washing sufficiently the developed PS plate. Thus, the object of the inventors has been attained.

Next, the invention will be explained in detail.

An imagewise exposed presensitized planographic printing plate is usually developed, washed, gummed, optionally rinsed, and dried to give a planographic printing plate.

In the invention, the well-known method of processing a PS plate can be used, but the preferable is a method in which a large amount of developer can be supplied onto a PS plate such as an immersing method or a nozzle supplying method. The developer supplied onto the PS plate is preferably stirred, the stirring method comprising showering in the developer or brushing.

In the invention, completion of the developing step is time when supplying of the developer onto the PS plate is completed. Completion of the developing step in the immersing method is time when the developed PS plate comes out from the developer, and completion of the developing step in the nozzle supplying method is time when the developed PS plate passes through the developer squeegeeing means such as the last squeegeeing rollers or the last blade in the developing step.

In the invention, a conventional developer can be used.

The developer in the invention can contain an alkali metal silicate, which is soluble in water, and the developer preferably contains at least 20% of potassium based on the total gram-atom of an alkali metal. The alkali metal silicate includes sodium silicate, potassium silicate and lithium silicate. The developer contains the alkali metal silicate in an amount of preferably 0.5 to 5 weight %, and more preferably 0.8 to 4.0 weight % in terms of silicon dioxide.

The potassium content as described above is preferably 20 to 100%, and more preferably 30 to 100%.

The developer optionally contains another alkali agent. The alkali agent includes an inorganic alkali agent such as potassium hydroxide, sodium hydroxide, lithium hydroxide, a di or trisodium phosphate, a di or triammonium phosphate, sodium metasilicate, sodium bicarbonate, sodium borate, ammonium borate or ammonia, and an organic alkali agent such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, triisopropanolamine, ethyleneimine, ethylenediamine or pyridine.

The developer preferably contains an organic acid. The organic acid includes a fatty acid and an aromatic carboxylic acid.

The fatty acid is preferably an alkanoic acid with 6 to 20 carbon atoms, and more preferably an acid represented by formula $C_nH_{2n+1}COOH$ (in which n represents an integer of 6 to 12), for example, caproic acid, enanthic acid, palmitic acid and stearic acid. The fatty acid may be an unsaturated fatty acid or a fatty acid with a branched hydrocarbon group. Besides the above, the fatty acid includes malic acid, citric acid, malonic acid, tartaric acid, maleic acid, fumalic acid oxalic acid, and lactic acid.

The aromatic carboxylic acid includes benzoic acid, o-chlorobenzoic acid, p-chlorobenzoic acid, o-hydroxybenzoic acid, p-hydroxybenzoic acid, p-tert-butylbenzoic acid, o-aminobenzoic acid, p-aminobenzoic acid, 2,3-dihydroxybenzoic acid, 2,4-dihydroxybenzoic acid, 2,5-dihydroxybenzoic acid, 2,6-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid.

The organic acid can be used in its sodium, potassium or ammonium salt form.

The developer contains the organic acid or its salt in an amount of preferably 0.1 to 30 weight %.

The developer optionally contains an organic solvent or various surfactants. Of the surfactants, an anionic surfactant includes a salt of a higher alcohol sulfate with 8–22 carbon atoms such as sodium laurylalcohol sulfate, sodium octylalcohol sulfate, ammonium laurylalcohol sulfate, sodium laurylalcohol sulfate, or sodium alkylsulfate, a salt of an aliphatic alcohol sulfate such as sodium acetylalcohol sulhate, an alkylarylsulfonic acid salt such as an alkylbenzene sulfonic acid salt, an alkylnaphthalene sulfonic acid salt, or sodium metanitrobenzene sulfonate, sodiumsulfoalkyl amide such as $C_{17}H_{33}CON(CH_3)CH_2CH_2SO_3Na$, and a sulfonic acid salt of a dibasic fatty acid ester such as dioctyl sodiumsulfo-succinate or dihexyl sodiumsulfo-succinate.

An amphoteric surfactant includes an alkylcarboxy betaine type, alkylaminocarboxylic acid type, alkylimidazoline type compound and an organic boron compound disclosed in Japanese Patent Publication No. 1-57895.

A nonionic surfactant includes a surfactant disclosed in Japanese Patent O.P.I. Publication Nos. 59-84241, 62-168160 and 62-175758, and a cationic surfactant includes a surfactant disclosed in Japanese Patent O.P.I. Publication No. 62-175757.

The surfactant content of the developer is preferably 0.001 to 5 weight %.

The organic solvent is suitably a solvent having a solubility in water of 10 weight % or less, and preferably 2 weight % or less. The organic solvent includes 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzylalcohol, m-methoxybenzylalcohol, p-methoxybenzylalcohol, benzylalcohol, cyclohexanol, 2-methyl cyclohexanol, 4-methylcyclohexanol, and 3-methyl cyclohexanol.

The organic solvent content of the developer is preferably 0.1 to 5 weight %. The organic solvent content is closely related to the surfactant content, and it is preferred that as the organic solvent content is higher, the surfactant content is also higher.

The developer optionally contains an alkali soluble mercapto compound and/or a thioether compound, a water soluble reducing agent, an anti-foaming agent or a water softener.

The water softener includes polyphosphates such as $Na_2P_2O_7$, $Na_3P_1O_9$, $Na_2P_2O_7$, $Na_2O_1(NaO_3P)PO_3Na_2$, and calgon (sodium polymetaphosphate), aminopolycarboxylic acids or their salts such as ethylenediaminetetraacetic acid or its sodium or potassium salt, diethylenetriaminepentaacetic acid or its sodium or potassium salt, triethylenetetraminehexaacetic acid or its sodium or potassium salt, hydroxyethylethylenediaminetriacetic acid or its sodium or potassium salt, nitrilotriacetic acid or its sodium or potassium salt, 1,2-diaminocyclohexane-tetraacetic acid or its sodium or potassium salt, 1,3-diamino-2-propanoltetraacetic acid or its sodium or potassium salt, and an organic sulfonic acid salt such as ethylenediaminetetra(methylene sulfonic acid) or its sodium or potassium salt. The water softener content of the developer varies on hardness or amount of a hard water used, but the content is preferably 0.01 to 5 weight %, and more preferably 0.01 to 0.5 weight %.

The water soluble reducing agent includes a phenolic compound such as hydroquinone or methoxyquinone, an amine compound such as phenylamine or phenylhydrazine, a sulfite such as sodium sulfite, potassium sulfite or sodium bisulfite, a phosphite such as potassium phosphite, potassium hydrogen phosphite sodium thiosulfate, and sodium dithionite. The water soluble reducing agent content of the developer is preferably 0.01 to 10 weight %.

The alkali soluble mercapto compound and/or thioether compound is preferably a compound having at least one mercapto group and/or at least one thioether group and at least one acid reidue in the molecule, and more preferably a compound having at least one mercapto group and at least one carboxyl group in the molecule. The examples thereof include mercapto-acetic acid, 2-mercaptopropionic acid, 3-mercaptopropionic acid, 4-mercaptobutanoic acid, 2,4-dimercaptobutanoic acid, 2-mercaptotetradecanoic acid, 2-mercaptomyristic acid, mercaptosuccinic acid, 2,3-dimercaptosuccinic acid, cysteine, N-acetylcysteine, N-(2-mercaptopropionyl)glycine, N-(2-mercapto-2-methylpropionyl)glycine, N-(3-mercaptopropionyl)glycine, N-(2-mercapto-2-methylpropionyl)cysteine, penicilamine, N-acetylpenicilamine, a glycine-cysteine-glutamine condensate, N-(2,3-dimercaptopropionyl)glycine, 2-mercaptonicotnic acid, thiosalicylic acid, 3-mercaptobenzoic acid, 4-mercaptobenzoic acid, 3-carboxy-4-mercaptopyridine, 2-mercaptobenzothiazole-5-carboxylic acid, 2-mercapto-3-phenylpropenic acid, 2-mercapto-5-carboxyethylimidazole, 5-mercapto-1-(4-carboxyphenyl)-tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio) hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonamide, 3-mercapto-4-(2-methylaminosulfonylethoxy) toluene, 3-mercapto-4-(2-methylaminosulfonylaminoethoxy) toluene, 4-mercapto-N-(p-methylphenylsulfonyl)benzamide, 4-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptane, tetraethylene glycol, 2-mercapto-4-octylphenylmethylether, 2-mercapto-4-octylphenolmethanesulfonylaminoethylether, 2-mercapto-4-octylphenylmethylaminosulfonylbutylether, thiodiglycolic acid, thiodiphenol, 6,8-dithiooctanoic acid, and an alkali metal, alkali earth metal or organic amine salt thereof. The content of the alkali soluble mercapto compound or thioether compound in the developer is preferably 0.01 to 5 weight %.

In the method of the invention, the developing time is preferably 5 to 60 seconds, and more preferably 6 to 20 seconds.

The developer is preferably replenished with a developer replenisher when a large amount of exposed presensitized planographic printing plates are processed. The composition of the developer replenisher may be the same as or different from that of the developer, but activity (such as pH) of the developer replenisher is preferably higher than that of the developer.

The developer replenisher contains the alkali metal silicate in an amount of preferably 0.5 to 5 weight %, and more preferably 0.8 to 4.0 weight % in terms of silicon dioxide, wherein the molar ratio of the silicon dioxide to the alkali metal is preferably 0.1 to 0.5.

In the invention, washing is carried out using tap water or well water as a washing water, and the washing can be repeatedly used while circulating. The washing water may contain a chelating agent, an anti-fungal, an antiseptic or an anti-mold agent. The chloric components or impurities in the washing water may be removed using a purification device.

In the method of the invention, the washing time is preferably 0.1 to 20 seconds, and more preferably 0.1 to 10 seconds.

In the invention, the ratio W/D is 3 or more, preferably 3 to 15, and more preferably 3 to 8.

In the invention, the beginning of the washing is time beginning supplying the washing water on the surface of the developed printing plate, and completion of the washing is time finishing supplying the washing water on the surface of the developed printing plate.

The washing can be carried out by one or more steps. When the washing step comprises several steps, and the crossover time taken from the upstream step to the following step is 1 second or more, the effects of the invention are not always attained.

The time taken from completion of development till the beginning of the washing is preferably 0.03 to 3 seconds, and more preferably 0.03 to 1 second.

The gumming solution preferably contains an acid or a buffering agent in order to remove the alkaline components contained in the developer. The gumming solution can further contain hydrophilic polymeric compounds, a chelating agent, a wetting agent, an antiseptic agent, or a dissolution auxiliary. When the gumming solution contains the hydrophilic polymeric compounds, the solution serves as a protective agent to prevent damage or stain on the printing plate obtained after processing.

The gumming solution used in the invention preferably contains a surfactant such as a nonionic or anionic surfactant in order to improve the coated surface.

The hydrophilic polymeric compounds includes gum arabic, a cellulose derivative (for example, carboxymethylcellulose, carboxyethylcellulose or methylcellulose) or its modified compounds, polyvinyl alcohol or its derivative, polyvinyl pyrrolidone, polyacrylamide or an acrylamide copolymer, vinylmethylether-maleic anhydride copolymer, vinylacetate-maleic anhydride copolymer, and styrene-maleic anhydride copolymer.

The gumming solution generally has a pH of 3 to 6.

In an automatic processor, transporting a PS plate horizontally is advantageous in shortening time taken from development till washing, and a method of supplying developer through nozzles is advantageous in obtaining a compact one.

Figure 2:
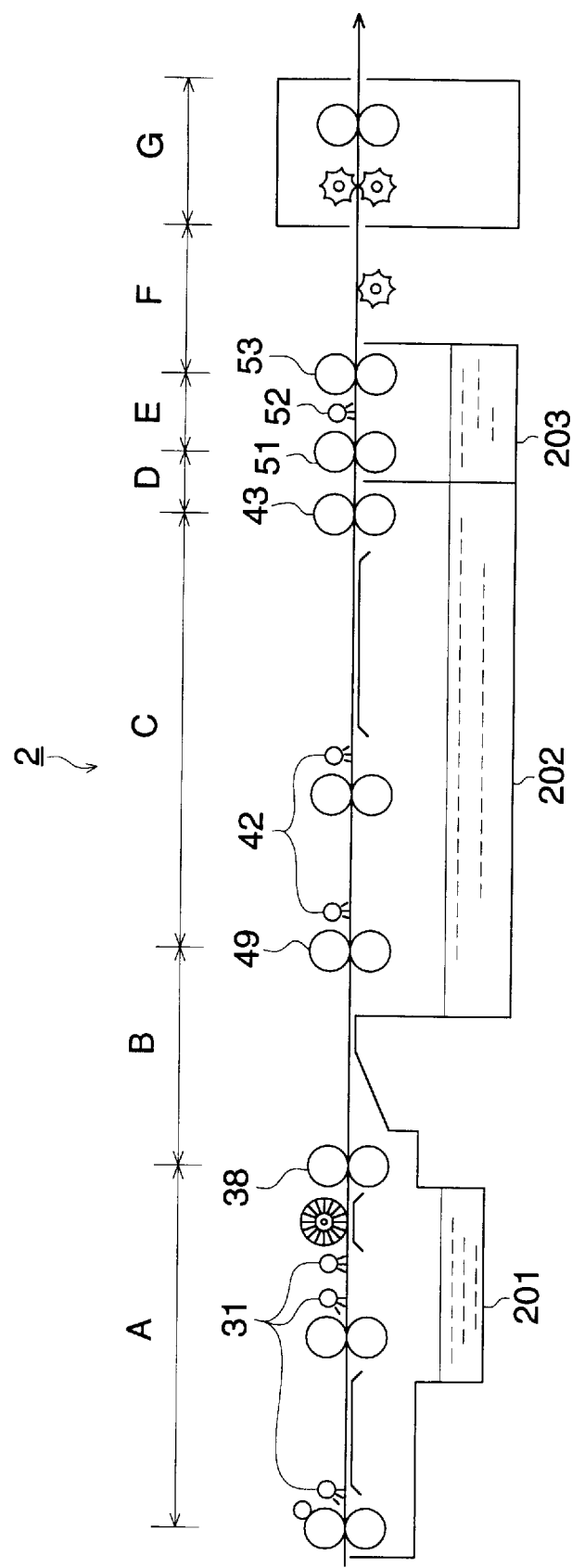
Figure 3:
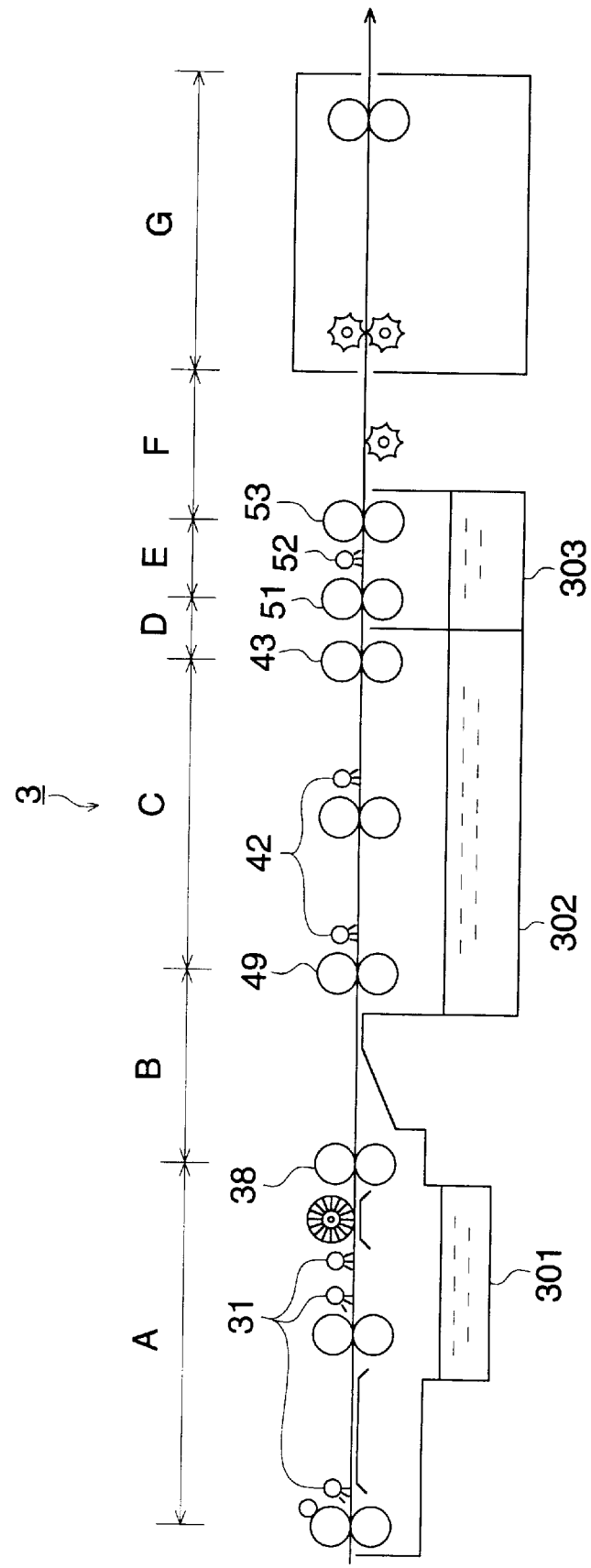

In FIGS. 1, 2, and 3, a presensitized planographic printing plate is transported in automatic processors 1, 2, and 3, passing through a developing section A, a cross-over section B from the developing section to a water washing section C, the water washing section, a cross-over section D from the washing section to a gumming section E, the gumming section, a cross-over section F from the gumming section to a drying section G, and the drying section.

Automatic processor 1 in FIG. 1 will be explained below.

In the developing section A, developer is supplied to an exposed presensitized planographic printing plate being transported from developer nozzles 31 connected to developing tank 101 with pipes (not illustrated), the developer being fed to the nozzle and circulated through pumps (not illustrated).

In the cross-over section B from the developing section to the water washing section C, the developed plate is transported from developer squeegeeing rollers 38 to washing inlet blade 47. In the water washing section C, in which washing nozzles 42 connect washing tanks 102 through pipes (not illustrated), and the washing water is fed to the washing nozzles and circulated through pumps (not illustrated), the developer squeegeed plate is then transported for washing from the washing inlet blade to washing outlet rollers 43. In the cross-over section D from the washing section to the gumming section E, the washed plate is transported from washing outlet rollers to gumming inlet rollers 51. In the gumming section E in which a gumming solution nozzle 52 is connected to gumming solution tank 103 through a pipe (not illustrated) so that the gumming solution is fed to the nozzle 52 and circulated through a pump (not illustrated), the washed plate is transported for gumming solution coating from the gumming inlet rollers 51 to gumming solution coating rollers 53. Then, the gumming solution coated plate is transported through the crossover section F and the drying section G to obtain a planographic printing plate.

An automatic processor in FIG. 2 will be explained below.

In the developing section A, developer is supplied to an exposed presensitized planographic printing plate being transported from developer nozzles 31 connected to developing tank 201 with pipes (not illustrated), the developer being fed to the nozzle and circulated through pumps (not illustrated). In the cross-over section B from the developing section to the water washing section C, the developed plate is transported from developer squeegeeing rollers 38 to washing inlet rollers 49. In the water washing section C, in which washing nozzles 42 connect washing tank 202 through pipes (not illustrated), and the washing water is fed to the washing nozzles and circulated through pumps (not illustrated), the developer squeegeed plate is then transported for washing from the washing inlet rollers to washing outlet rollers 43. In the cross-over section D from the washing section to the gumming section E, the washed plate is transported from washing outlet rollers to gumming inlet rollers 51. In the gumming section E in which a gumming solution nozzle 52 is connected to gumming solution tank 203 through a pipe (not illustrated) so that the gumming solution is fed to the nozzle 52 and circulated through a pump (not illustrated), the washed plate is transported for gumming solution coating from the gumming inlet rollers 51 to gumming solution coating rollers 53. Then, the gumming solution coated plate is transported through the crossover section F and the drying section G to obtain a planographic printing plate.

An automatic processor in FIG. 3 will be explained below.

In the developing section A, developer is supplied to an exposed presensitized planographic printing plate being transported from developer nozzles 31 connected to developing tank 301 with pipes (not illustrated), the developer being fed to the nozzle and circulated through pumps (not illustrated). In the cross-over section B from the developing section to the water washing section C, the developed plate is transported from developer squeegeeing rollers 38 to washing inlet rollers 49. In the water washing section C, in which washing nozzles 42 connect washing tank 302 through pipes (not illustrated), and the washing water is fed to the washing nozzles and circulated through pumps (not illustrated), the developer squeegeed plate is then transported for washing from the washing inlet rollers to washing outlet rollers 43. In the cross-over section D from the washing section to the gumming section E, the washed plate is transported from washing outlet rollers to gumming inlet rollers 51. In the gumming section E in which a gumming solution nozzle 52 is connected to gumming solution tank 303 through a pipe (not illustrated) so that the gumming solution is fed to the nozzle 52 and circulated through a pump (not illustrated), the washed plate is transported for gumming solution coating from the gumming inlet rollers 51 to gumming solution coating rollers 53. Then, the gumming solution coated plate is transported through the crossover section F and the drying section G to obtain a planographic printing plate.

In the automatic processor, the washing time W is the time required for the leading edge of the developed plate to pass the washing section C, and the cross-over time D is the time required for the leading edge of the developed plate to pass cross-over section B from the developing section to the water washing section.

In the invention, the ratio W/D of the washing time W to the cross-over time D (taken from completion of the developing step to the beginning of the washing step) is 3 or more.

The presensitized planographic printing plate in the invention may be a conventional presensitized planographic printing plate. The PS plate which can be processed according to the method of the invention may be has a negative-working or positive-working presensitized planographic printing plate. The PS plate has a light sensitive layer on a support. The negative-working PS plate has a negative-working light sensitive layer on a support, and the positive-working PS plate has a positive-working light sensitive layer on a support.

The negative-working light sensitive material includes a photo-polymerizable light sensitive composition, photo-crosslinking light sensitive composition and a diazo type light sensitive composition.

The photo-polymerizable light sensitive composition used in the invention is not specifically limited, and a conventional photo-polymerizable light sensitive composition can be used. The preferable composition thereof comprises (a) a vinyl monomer having at least two double bonds in the ends, (b) a photo-initiator, and a polymeric compound as a binder.

The vinyl monomer content, the photo-initiator content, and the polymeric compound content of the photo-polymerizable light sensitive composition are 20 to 80 weight %, 0.1 to 20 weight %, and 20 to 80 weight %, respectively. The photo-polymerizable light sensitive composition can contain a diazonium compound, a thermal polymerization inhibitor, a plasticizer, a dye and pigment.

The photo-crosslinkable light sensitive composition used in the invention is not specifically limited, and a conventional photo-crosslinkable light sensitive composition can be used. The preferable composition thereof comprises a composition comprising a compound having a group capable of being photo-dimerized. The compound having a group capable of being photo-dimerized can be used singly or in admixture of two or more kinds thereof. The photo-crosslinkable light sensitive composition preferably contain a sensitizer in addition to the above compound having a group capable of being photo-dimerized. The photo-crosslinkable light sensitive composition optionally contains inorganic powder or a polymer.

The diazo type light sensitive composition used in the invention is not specifically limited, and a conventional diazo type light sensitive composition can be used. The typical diazo compound is a diazo resin which is a condensation product of p-diazodiphenylamine with formaldehyde, and is preferably a water insoluble and organic solvent soluble diazo resin. The water insoluble and organic solvent soluble diazo resin includes a diazo resin disclosed in Japanese Patent Publication Nos. 47-1167 and 57-43890. The light sensitive layer containing the diazo resin preferably contains an alkali soluble resin such as a vinyl polymer having a phenolic hydroxy group.

The diazo resin content of the diazo type light sensitive composition are ordinarily 1 to 20 weight %, and preferably 2 to 10 weight %. The negative-working PS plate in the invention has the above described photo-polymerizable light sensitive composition, photo-crosslinking light sensitive composition or diazo type light sensitive composition on a support.

Next, an o-quinonediazide compound, which is used in the positive-working presensitized planographic printing plate in the invention, will be explained. The positive-working presensitized planographic printing plate in the invention has a light sensitive layer containing the o-quinonediazide compound on a support.

The o-quinonediazide compound includes an o-naphthoquinonediazide compound such as an ester compound of o-naphthoquinonediazide sulfonic acid with a polycondensate resin of phenols with aldehydes or ketones.

The o-quinonediazide compound includes those disclosed in Japanese Patent O.P.I. Publication No. 58-43451. The examples thereof include conventional 1,2-quinonediazide compounds such as 1,2-benzoquinonediazide-sulfonate, 1,2-benzoquinonediazidesulfonamide, 1,2-naphthoquinonediazide-sulfonate and 1,2-naphthoquinonediazide-sulfonamide and, further, include 1,2-quinonediazide compounds such as 1,2-benzoquinonediazide-4-sulfonic acid phenyl ester, 1,2,1',2'-di-(benzoquinonediazide-4-sulfonyl)dihydroxybiphenyl, 1,2-benzoquinonediazide-4-(N-ethyl-N-β-naphthyl) sulfonamide, 1,2-naphthoquinonediazide-5-sulfonic acid cyclohexyl ester, 1-(1,2-naphthoquinonediazide-5-sulfonyl)-3,5-dimethylpyrazole, 1,2-naphthoquinonediazide-5-sulfonic acid-4'-hydroxydiphenyl-4'-azo-β-naphthol ester, N,N-di-(1,2-naphthoquinonediazide-5-sulfonyl)-aniline, 2'-(1,2-naphthoquinonediazide-5-sulfonyloxy)-1-hydroxyanthraquinone, 1,2-naphthoquinonediazide-5-sulfonic acid-2,4-dibydroxybenzophenone ester, 1,2-naphthoquinonediazide-5-sulfonic acid-2,3,4-trihydroxybenzophenone ester, a condensation product of 2 moles of 1,2-naphthoquinonediazide-5-sulfonic acid chloride with 1 mole of 4,4'-diaminobenzophenone, a condensation product of 2 moles of 1,2-naphthoquinonediazide-5-sulfonic acid chloride with 1 mole of 4,4'-dihydroxy-1,1'-diphenylsulfone, a condensation product between 1 mole of 1,2-naphthoquinonediazide-5-sulfonic acid chloride and 1 mole of purpurogallin, and 1,2-naphthoquinonediazide-5-(N-dihydroxyabiethyl)-sulfonamide described in J. Kosar, Light-Sensitive Systems, John Wily & Sons, New York, pp. 339–352 (1965) and WS. De Forest, Photoresist, Vol. 50, McGraw-Hill, New York (1975). Other examples are 1,2-quinonediazide compounds described in Japanese Pat. Exam. Pub. Nos. 37-1953, 37-3627, 37/13109, 40/26126, 40/3801, 45/5604, 45/27345 and 51/13013, and Japanese Pat. O.P.I. Pub. Nos. 48/96575, 48/63802 and 48/63803.

In the invention, the above o-quinonediazide compound may be used singly or in combination.

The light sensitive layer containing o-quinonediazide compounds preferably contains an alkali soluble resin. The alkali soluble resin includes a novolak resin, a vinyl polymer having a phenolic hydroxy group, and a polycondensate of polyhydric phenol with aldehyde or ketone disclosed in Japanese Patent O.P.I. Publication No. 55-57841.

The above novolak resin includes a phenol-formaldehyde resin, a cresol-formaldehyde resin, a phenol-cresol-formaldehyde resin disclosed in Japanese Patent O.P.I. Publication No. 55-57841, and a copolycondensate of a p-substituted phenol, and phenol or cresol with formaldehyde disclosed in Japanese Patent O.P.I. Publication No. 55-127553.

The novolak resin has a number average molecular weight (Mn) of preferably $3.00 \times 10^2$ to $7.50 \times 10^3$, more preferably $5.00 \times 10^2$ to $4.00 \times 10^3$, and a weight average molecular weight (Mw) of preferably $1.00 \times 10^3$ to $3.00 \times 10^4$, more preferably $3.00 \times 10^3$ to $2.00 \times 10^4$, in terms of polystyrene standard.

The above novolak resin may be used singly or in combination.

When the novolak resin is used, the novolak resin content of the light sensitive layer is preferably 5 to 95% by weight.

The o-quinonediazide compound content of the light sensitive layer is preferably 6 to 60% by weight, and more preferably 10 to 50% by weight. The light sensitive layer containing o-quinonediazide compounds optionally contains a plasticizer, a surfactant, an organic acid or an acid anhydride. The light sensitive layer containing o-quinonediazide compounds can further contain a lipophilic agent such as a p-tert-butylphenol formaldehyde resin, a p-n-octylphenol formaldehyde resin or an ester resin thereof partially esterified with an o-quinonediazide compound in order to increase the lipophilicity of the light sensitive layer.

In the invention, the light sensitive layer containing photopolymerization type light sensitive materials and/or photo-crosslinking type light sensitive materials or o-quinonediazide compounds can contains a print-out material which forms a visible image after exposure. The print-out material is composed of a compound capable of producing an acid or free radical on light exposure and an organic dye varying its color on reaction with the free radical or acid.

The dye is preferably a dye varying its color on reaction with a free radical or an acid. The term "varying its color" includes changing colorless to color, color to colorless or changing its color. The preferable dye is a dye varying its color by forming a salt with an acid.

The light sensitive layer can further contain various additives other than those described above, for example, alkylethers (such as ethylcellulose or methylcellulose), a fluorine-containing surfactant, a nonioic surfactant (such as Pluronic L-64 produced by Asahidenka Co., Ltd.), a plasticizer for giving flexibility or antiabrasion to the coated layer (such as butylphthalate, polyethylene glycol, tributylcitrate, diethylphthalate, dibutylphthalate, dihexylphthalate, dioctylphthalate, tricresyl phosphate, tributyl phosphate, trioctyl phosphate, tetrahydrofurfuryloleate, an olygomer or polymer of acrylic acid or methacrylic acid), an lipophilic agent for improving a lipophilicity of image portions (such as an alcohol half ester of styrene-maleic anhydride copolymer disclosed in Japanese Patent O.P.I. Publication No. 55-527/1980), a stabilizing agent (such as phosphoric acid, phosphorous acid, an organic acid, for example, citric acid, oxalic acid, benzenesulfonic acid, naphthalene sulfonic acid, 4-methoxy-2-hydroxybenzophenone-5-sulfonic acid, glutaric acid), a development accelerator (such as higher alcohols or acid anhydrides). The content of these additives is generally 0.01 to 30 weight % based on the total solid component weight of the composition, although it varies depending on the objects of the usage.

The presensitized lithographic printing plate in the invention is prepared by dissolving the components described above in a solvent to obtain a coating solution, coating the solution on a support and then drying the coated to form a light sensitive layer on the support.

The coating method for coating the light sensitive layer on a support includes a conventional coating method such as whirl coating, wire bar coating, dip coating, air-knife coating, roll coating, blade coating or curtain coating. The concentration of the coating solution is preferably 1 to 50 weight %. The coating amount is preferably 0.2 to 10.0 g/m$^2$ as a solid.

The support includes paper, paper laminated with a film of a plastic (for example, polyethylene, polypropylene, polystyrene), a plate of a metal such as aluminum (including an aluminum alloy), zinc or copper, a film of a plastic such as cellulose diacetate, cellulose triacetate, cellulose propionate, polyethylene terephthalate, polyethylene, polypropylene, polycarbonate, or polyvinyl acetal, a plastic film or paper laminated or vapor-deposited with the above described metal, and a steel plate plated with aluminum or chromium. Of these, an aluninum support or a complex support covered with an aluminum plate is preferable.

The aluninum support is preferably surface roughened in order to enhance a water keeping property and improve its adhesion to a light sensitive layer on it.

The surface roughening method includes a conventional method such as brush-roughening, ball-roughening, electrolytically etching, chemically etching, liquid honing, or sand blasting. Of these, brush-roughening, electrolytically etching, chemically etching, and liquid honing are preferable, and electrolytically etching is more preferable. As the electrolyte solution used in the electrolytically etching is used an aqueous solution containing an acid, an alkali or a salt thereof or an aqueous solution containing an organic solvent. Of these, the electrolyte solution containing hydrochloric acid, nitric acid or a salt thereof is especially preferable. The surface-roughened aluminun plate is optionally desmut with an aqueous acid or alkaline solution. The resulting aluminun plate is preferably anodised, and the anodizing is carried out preferably in an aqueous phosphoric acid or sulfuric acid solution. Thereafter, the aluminum plate may be further treated with an alkali metal silicate solution or hot water or may be surface treated with an aqueous solution containing a water soluble polymer or an aqueous potassium zirconium fluoride solution.

A backing layer (also called a back coat layer) containing metal oxides obtained by hydrolyzing or polycondensating organic or inorganic metal compounds is preferably provided on the surface of the support opposite the light sensitive layer whereby an anodized aluminum oxide dissolution in developer is minimized.

The coating amount of the backing layer may be any, as long as it prevents from dissolving the aluminum in the developer. The coating amount of the backing layer is preferably 0.001 to 10 g/m$^2$, more preferably 0.01 to 1 g/m$^2$, and still more preferably 0.02 to 0.1 g/m$^2$.

The backing layer can be coated on the surface of the support opposite the light sensitive layer according to various coating methods. In order to obtain the above described coating amount, the most preferable coating method is a method including preparing a backing layer coating solution, coating the solution on a support and drying.

In a negative-working presensitized planographic printing plate having a photopolymerization type and/or photo-crosslinking type light sensitive layer on a support, a protective layer comprised of an oxygen shielding polymer such as polyvinyl alcohol or acidic cellulose may be provided on the light sensitive layer in order to minimize polymerization inhibition due to oxygen in air.

The presensitized planographic printing plate is exposed to light through a transparent original having a line image or a dot image. The light source for exposure includes a carbon arc lamp, a mercury lamp, a xenon lamp, a metal halide lamp and strobe.

The invention will be detailed in the following examples, but is not limited thereto.

EXAMPLE 1
(Preparation of Presensitized Planographic Printing Plate 1)

A 0.3 mm thick aluminum plate (material 1050, refining H 16) was dipped for 1 minute in a 10% sodium hydroxide aqueous solution kept at 85° C. to degrease, and then washed with water. The resulting aluminum plate was dipped for 1 minute in a 10% sulfuric acid aqueous solution kept at 25° C. to desmut, and then washed with water. The resulting aluminum plate was electrolytically etched in 2.0% nitric acid aqueous solution for 30 seconds at 30° C. at a current density of 80 A/dm$^2$. The etched plated was dipped for 10 seconds in a 1% sodium hydroxide aqueous solution at 70° C., then washed with water, dipped for 10 seconds in a 10% sulfuric acid aqueous solution kept at 25° C., and then washed with water. The resulting plate was anodized for 1 minute in a 30% sulfuric acid aqueous solution at 35° C. at a current density of 3 A/dm$^2$, and then washed with water. The resulting plate was dipped for 30 seconds in a 0.01% polyvinyl phosphonic acid aqueous solution kept at 80° C., and then dried for 5 minutes at 80° C. Thus, an aluminum support 1 was obtained.

A 10 g/liter aqueous solution of sodium silicate (according to JIS No. 3) was coated on one surface of the support 1 opposite a light sensitive layer, using a wire bar, and dried for 3 minutes at 80° C. to give a backing layer having a dry thickness of 10.0 mg/m$^2$. Thus, an aluminum support 1 was obtained.

The following light sensitive composition coating solution 1 was coated on the surface of the support 2 opposite the backing layer by a wire bar, and then dried for 2 minutes at 80° C. to give a light sensitive layer having a dry thickness of 2.0 g/m$^2$. Thus, a presensitized planographic printing plate 1 was obtained.

| (Light Sensitive Composition Coating Solution 1) | |
|---|---|
| Polymeric Compound 1 | 0.20 g |
| Hydroxypropyl-β-cyclodextrin | 0.20 g |
| Novolak resin (phenol/m-cresol/p-cresol, 10/54/36, mol ratio), Mw: 4,000) | 6.70 g |
| Condensation product (esterification rate: 30%) of a pyrogallol-acetone resin (Mw: 3,000) with o-naphthoquinone diazide-5-sulfonylchloride | 1.50 g |
| Polyethylene glycol #2,000 | 0.20 g |
| Bictoria Pure Blue BOH (made by Hodogaya Kagaku Co., Ltd.) | 0.08 g |
| 2,4-Bis(trichloromethyl)-6-(p-methoxystytryl)-s-tyriazine | 0.15 g |
| Fluorine-containing surfactant FC-430 (made by Sumitomo 3M Co., Ltd.) | 0.03 g |
| Cis-1,2-Cyclohexanedicarboxylic acid | 0.20 g |
| Methylethyl ketone/propylene glycol monomethyl ether = 3/7 | 100 ml |

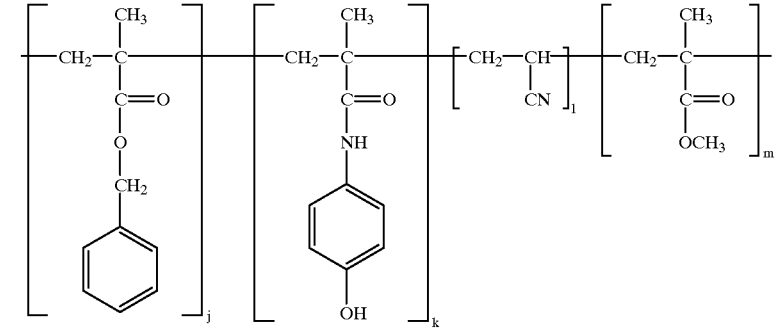

In an automatic processor 1 as shown in FIG. 1, developing tank 101 was charged with 25 liters of the following developer 1, washing tank 102 was charged with tap water, and gumming solution tank 103 was charged with 10 liters of a solution in which the following gumming solution 1 was diluted with water by a factor of two. In order to clarify the effects of the invention, 50 m² of the presensitized planographic printing plate 1 was entirely exposed and processed without replenishing developer replenisher while employing automatic processor 1. Thus, the developing activity of the developer was lowered.

| (Developer 1) | |
| --- | --- |
| A potassium silicate (SiO₂: 26 wt %, K₂O: 13 wt %) | 100 weight parts |
| Potassium hydroxide (50% aqueous solution) | 86 weight parts |
| Phthalic acid | 18 weight parts |
| β-Oxynaphthoic acid | 18 weight parts |
| Water | 1513 weight parts |
| (Finisher gumming solution 1) | |
| White dextrin | 5.0 weight parts |
| Hydroxypropylated starch | 10 weight parts |
| Gum arabic | 1.0 weight part |
| Ammonium primary phosphate | 0.1 weight parts |
| Sodium dilaurylsuccinate | 0.15 weight parts |
| Polyoxyethylene nonylphenyl ether | 0.5 weight parts |
| Ethylene glycol | 1.0 weight part |
| EDTA | 0.005 weight parts |
| Dehydroacetic acid | 0.005 weight parts |
| Water | 100.0 weight parts |

Thereafter, the presensitized planographic printing plate 1 was evaluated for residual ball point pen ink according to the following method.

(Evaluation of Residual Ball Point Pen Ink)

A straight line was drawn on the light sensitive layer of the presensitized planographic printing plate 1 with a ball point pen (made by Pilot Co., Ltd.) with a load of 50, 75 or 100 g applied. The resulting plate was entirely exposed to a 4 kW metal halide lamp Vio Quick made by Dainihon Screen Co., Ltd. from 90 cm distant. The exposed plate was processed employing an automatic processor 1 as shown in FIG. 1 under the following processing condition 1. The processed printing plate was visually evaluated for residual ball point pen ink on its surface.

| (Processing Condition 1) | |
| --- | --- |
| A: Developing Step | 10 seconds |
| B: Cross-over Step from Developing Step to Washing Step | 0.9 seconds |
| C: Washing Step: | 4.5 seconds |
| D: Cross-over Step from Washing Step to Gumming Step | 1.4 seconds |
| E: Gumming Step | 1.7 seconds |
| F: Cross-over Step from Gumming Step to Drying Step | 1.5 seconds |
| G: Drying Step | 4.6 seconds |

The results are shown in Table 1.

EXAMPLE 2

The presensitized planographic printing plate 1 was processed in the same manner as in Example 1, except that an automatic processor 2 as shown in FIG. 2 and the following processing condition 2 were used instead of an automatic processor 1 and processing condition 1, and evaluated for the residual ball point pen ink in the same manner as in Example 1.

| (Processing Condition 2) | |
| --- | --- |
| A: Developing Step | 10 seconds |
| B: Cross-over Step from Developing Step to Washing Step | 4.5 seconds |
| C: Washing Step: | 15 seconds |
| D: Cross-over Step from Washing Step to Gumming Step | 1.4 seconds |
| E: Gumming Step | 1.7 seconds |
| F: Cross-over Step from Gumming Step to Drying Step | 4.5 seconds |
| F: Drying Step | 9 seconds |

The results are shown in Table 1.

Comparative Example 1

The presensitized planographic printing plate 1 was processed in the same manner as in Example 1, except that an automatic processor 3 as shown in FIG. 3 and the following processing condition 3 were used instead of an automatic processor 1 and processing condition 1, and evaluated for the residual ball point pen ink in the same manner as in Example 1.

| (Processing Condition 3) | |
| --- | --- |
| A: Developing Step | 10 seconds |
| B: Cross-over Step from Developing Step to Washing Step | 4.5 seconds |
| C: Washing Step: | 9 seconds |
| D: Cross-over Step from Washing Step to Gumming Step | 1.4 seconds |
| E: Gumming Step | 1.7 seconds |
| F: Cross-over Step from Gumming Step to Drying Step | 4.5 seconds |
| F: Drying Step | 9 seconds |

The results are shown in Table 1.

TABLE 1

| | Example 1 | Example 2 | Comparative Example 1 |
| --- | --- | --- | --- |
| Cross-over time (D) taken from developing Step to washing Step (second) | 0.9 | 4.5 | 4.5 |
| Washing time (W) (second) | 4.5 | 15 | 9.0 |
| Ratio W/D | 5 | 3.3 | 2 |
| Residual ball point pen ink | No stain observed | Slight stain observed at a 100 g load | Stain observed at a 50 g load (not used in practical use) |

As is apparent from Table 1, the ratio W/D not less than 3 minimizes stain on the printing plate due to residual ball point ink.

What is claimed is:

1. A method of processing an exposed presensitized planographic printing plate employing an automatic processor, the method comprising the steps of:

developing the exposed presensitized planographic printing plate with a developer; and washing the developed printing plate with a washing water, wherein the ratio W/D of the washing time W to the cross-over time D taken from completion of the developing step to the beginning of the washing step is 3 or more.

2. The method of claim 1, wherein the ratio W/D is 3 to 15.

3. The method of claim 1, wherein the washing time is 0.1 to 20 seconds.

4. The method of claim 1, wherein the developing time is 5 to 60 seconds.

5. The method of claim 1, wherein the developer contains an alkali metal silicate.

6. The method of claim 5, wherein the developer contains the alkali metal silicate in an amount of 0.5 to 5 weight %.

7. The method of claim 5, wherein the developer contains potassium in an amount of 20 to 100% based on the total gram-atom of the alkali metal.

8. The method of claim 5, wherein the developer further contains an organic acid or its salt in an amount of preferably 0.1 to 30 weight %.

9. The method of claim 8, wherein the organic acid is an aromatic carboxylic acid.

10. The method of claim 1, wherein the presensitized planographic printing plate comprises a support and provided thereon, a positive-working light sensitive layer.

11. The method of claim 10, wherein the positive-working light sensitive layer contains an o-quinonediazide compound and an alkali soluble resin.

12. The method of claim 1, wherein the presensitized planographic printing plate comprises a support and provided thereon, a negative-working light sensitive layer.

13. The method of claim 12, wherein the negative-working light sensitive layer contains a diazo resin and an alkali soluble resin.

* * * * *